(12) United States Patent
Pappert et al.

(10) Patent No.: US 6,492,686 B1
(45) Date of Patent: Dec. 10, 2002

(54) INTEGRATED CIRCUIT HAVING BUFFERING CIRCUITRY WITH SLEW RATE CONTROL

(75) Inventors: Bernard J. Pappert, Austin, TX (US); Roger A. Whatley, Georgetown, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/479,093

(22) Filed: Jan. 7, 2000

Related U.S. Application Data

(62) Division of application No. 08/942,740, filed on Oct. 2, 1997.

(51) Int. Cl.[7] .......................... H01L 23/62; H01L 29/00
(52) U.S. Cl. ...................... 257/355; 257/356; 257/357; 257/360; 257/546
(58) Field of Search ................................ 257/355, 356, 257/357, 360, 546, 348; 361/100, 101

(56) References Cited

U.S. PATENT DOCUMENTS

| | | | | |
|---|---|---|---|---|
| 4,394,590 A | * | 7/1983 | Honda ........................ | 307/584 |
| 4,634,894 A | | 1/1987 | Shu et al. .................... | 307/297 |
| 4,829,350 A | * | 5/1989 | Miller ....................... | 357/23.13 |
| 4,970,420 A | | 11/1990 | Billings ....................... | 307/571 |
| 5,095,226 A | | 3/1992 | Tani ........................ | 307/296.1 |
| 5,434,531 A | * | 7/1995 | Allen et al. .................. | 327/530 |
| 5,506,535 A | | 4/1996 | Ratner ....................... | 327/333 |
| 5,537,067 A | | 7/1996 | Carvajal et al. ............ | 327/108 |
| 5,546,029 A | | 8/1996 | Koke ......................... | 327/108 |
| 5,550,701 A | * | 8/1996 | Nadd et al. .................. | 361/103 |
| 5,654,574 A | * | 8/1997 | Williams et al. ............ | 257/355 |
| 5,714,796 A | * | 2/1998 | Chishiki ..................... | 257/544 |
| 5,731,614 A | * | 3/1998 | Ham .......................... | 257/355 |
| 5,796,296 A | | 8/1998 | Krzentz ...................... | 327/545 |
| 5,870,330 A | * | 2/1999 | Chan et al. .................. | 365/154 |
| 6,097,067 A | * | 8/2000 | Ouchi et al. ................ | 257/369 |
| 6,222,789 B1 | * | 4/2002 | Chu ....................... | 365/230.06 |

* cited by examiner

*Primary Examiner*—Eddie Lee
*Assistant Examiner*—Jesse A. Fenty
(74) *Attorney, Agent, or Firm*—Susan C. Hill; Joanna G. Chiu

(57) ABSTRACT

Buffering circuitry (10) uses pull-up slew rate control circuitry (12) and pull-down slew rate control circuitry (14) to control the rising and falling slew rates of an output signal (50) provided by buffering circuitry (10). Pull-up slew rate control circuitry (12) and pull-down slew rate control circuitry (14) may be used in an embodiment of buffering circuitry (10) which provides a higher output voltage VHIGH than the standard power voltage VPOWER which is used to power most of the circuitry. Buffering circuitry (10) utilizes distributed resistive elements (89–91) to provide improved electrostatic discharge protection. Buffering circuitry (10) utilizes a low power level shifter (16). Voltage reference generation circuitry (18) may be used to provide a stable low power reference voltage VREF (42).

15 Claims, 3 Drawing Sheets

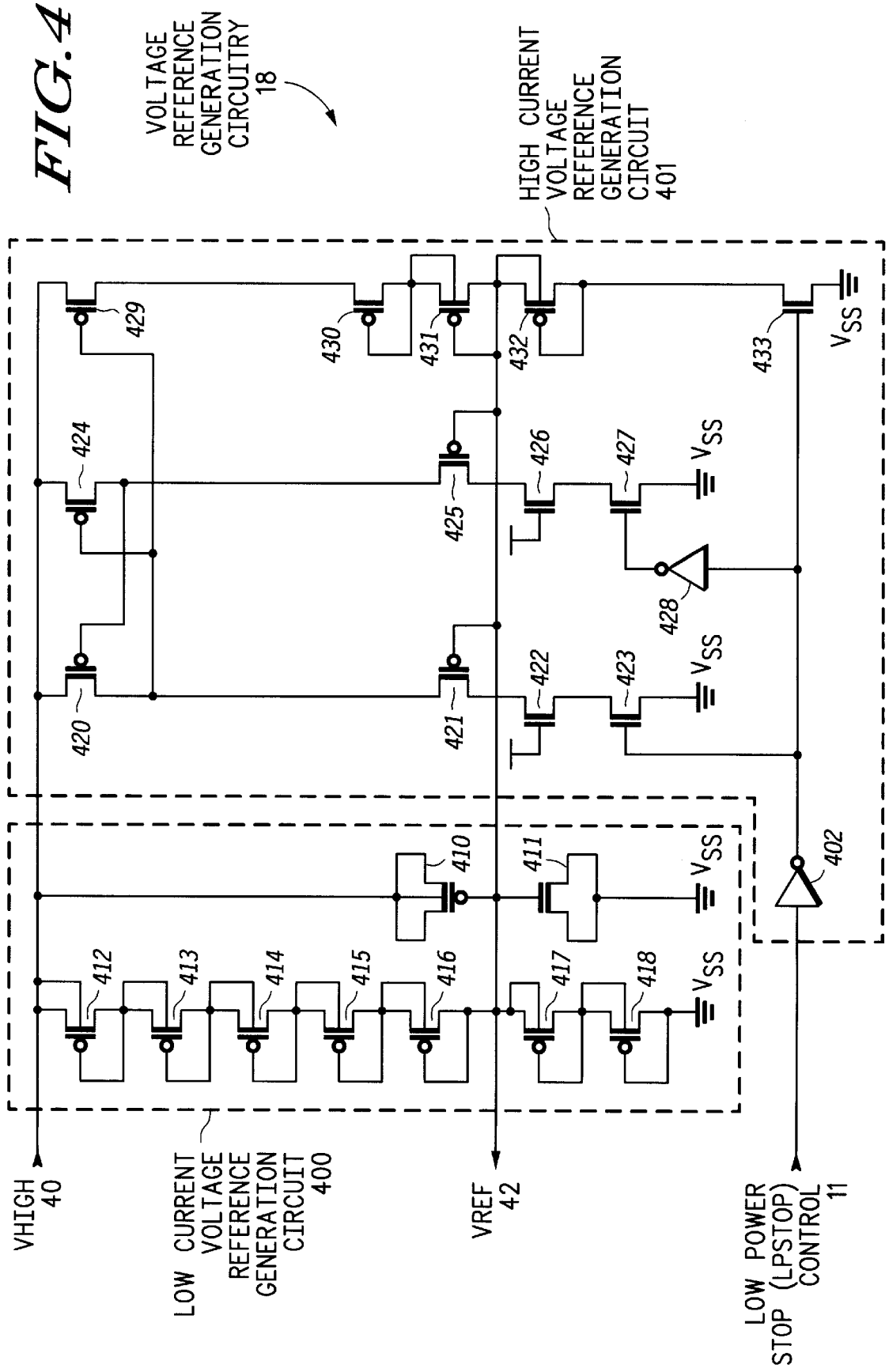

INTEGRATED CIRCUIT HAVING BUFFERING CIRCUITRY WITH SLEW RATE CONTROL

This is a division of application Ser. No. 08/942,740, filed Oct. 2, 1997.

FIELD OF THE INVENTION

The present invention relates in general to integrated circuits, and more particularly to buffering circuitry with slew rate control for use in integrated circuits.

BACKGROUND OF THE INVENTION

Buffer circuits are very common circuits used throughout integrated circuit design. Specific elements required by a buffer circuit may vary depending upon the constraints with which the buffer circuit must function. Although buffer circuits can be used throughout an integrated circuit, one common place where they are normally used is as an input/output buffer at the integrated circuit pads which are used to couple the integrated circuit to the external world.

One set of constraints for an input/output buffer is provided by the IEEE 1284 standard, which is used for driving a 62 ohm transmission line from the integrated circuit. The 1284 IEEE standard requires a precise slew rate, a precise output impedance, as well as input hysteresis. In addition to the constraints required by the 1284 IEEE standard, it is also often a requirement that an integrated circuit use as little power as possible. In addition, it is also desirable for most integrated circuits to have electrostatic discharge (ESD) protection. As yet another constraint, the internal circuitry within an integrated circuit may be designed using a process that requires a lower power voltage than the voltage required by the IEEE 1284 standard which requires 5 volts.

Although a buffer may be designed to meet a variety of design constraints, particular portions of the buffer design may be applicable to a wide variety of usages, some of which are outside of particular sets of constraints. For example, particular portions of a buffer design that improve ESD protection may be applicable to a wide variety of buffer circuits that do not have similar constraints. In addition, a buffer circuit that is designed to meet the IEEE 1284 standard for slew rate may be applicable to buffers that are used in other applications not requiring that standard. In addition, there may be particular value to subsets of the constraints listed above. For example, it may be particularly useful to have a buffer circuit that is both low power and meets the IEEE 1284 standard.

BRIEF DESCRIPTION OF THE DRAWINGS

FIG. 4 illustrates, in schematic diagram form, one embodiment of voltage reference generation circuitry 18 of FIG. 1 in accordance with one embodiment of the present invention.

DESCRIPTION OF THE PREFERRED EMBODIMENT

DESCRIPTION OF THE FIGURES

Figure 1:
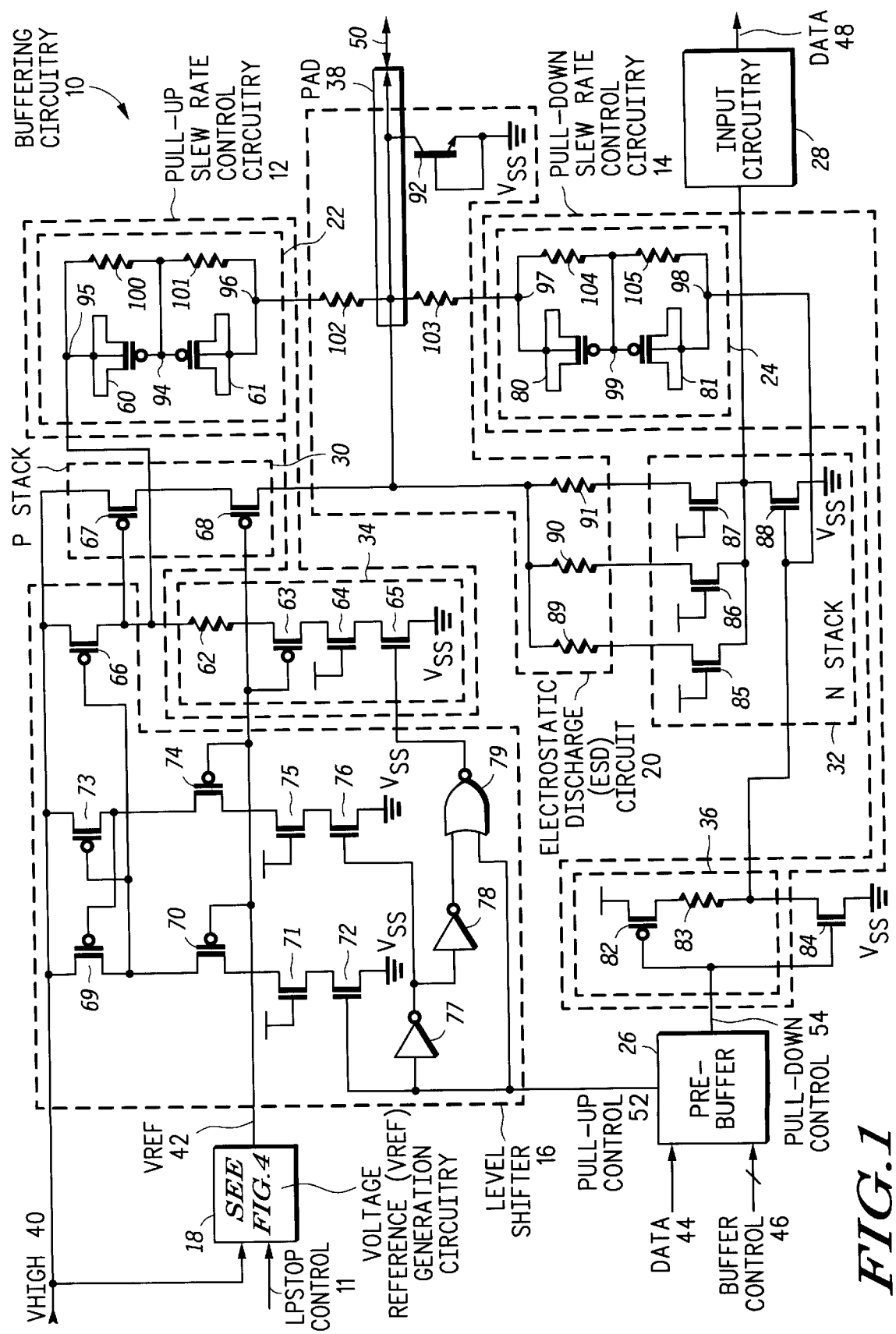
FIG. 1 illustrates, in partial block diagram form and partial schematic diagram, buffering circuitry 10 in accordance with one embodiment of the present invention.

Shown in FIG. 1 is buffering circuitry 10 in accordance with one embodiment of the present invention. Buffering circuitry 10 comprises voltage reference (VREF) generation circuitry 18, level shifter 16, a P stack 30, pull-up slew rate control circuitry 12, a pre-buffer 26, pull-down slew rate control circuitry 14, input circuitry 28, N stack 32, an input/output pad 38, electrostatic discharge (ESD) circuit 20, and an NMOS transistor 84. Voltage reference generation circuitry 18 receives signal VHIGH 40 as an input, receives the low power stop (LPSTOP 11) control signal as an input, and generates signal VREF 42 as an output.

In one embodiment, level shifter 16 comprises a PMOS transistor 69, a PMOS transistor 73, a PMOS transistor 66, a PMOS transistor 70, a PMOS transistor 74, an NMOS transistor 75, an NMOS transistor 76, an NMOS transistor 71, an NMOS transistor 72, an inverter 77, an inverter 78, and a NOR gate 79. The output of voltage reference generation circuitry 18, VREF 42, is coupled to the control electrode of PMOS transistor 70 and to the control electrode of PMOS transistor 74. The source of PMOS transistor 69 is coupled to signal VHIGH 40. The drain of PMOS transistor 69 is coupled to the source of PMOS transistor 70, and the drain of PMOS transistor 70 is coupled to the drain of NMOS transistor 71. The source of NMOS transistor 71 is coupled to the drain of NMOS transistor 72, and the source of NMOS transistor 72 is coupled to VSS or ground. The source of PMOS transistor 73 is coupled to signal VHIGH 40, and the drain of PMOS transistor 73 is coupled to the source of PMOS transistor 74 and to the control electrode of PMOS transistor 69.

The control electrode of PMOS transistor 73 is coupled to the drain of PMOS transistor 69 and to the control electrode of PMOS transistor 66, whose source is also coupled to signal VHIGH 40. The drain of PMOS transistor 74 is coupled to the drain of NMOS transistor 75, and the source of NMOS transistor 75 is coupled to the drain of NMOS transistor 76. The source of NMOS transistor 76 is coupled to VSS or ground. The control electrode of NMOS transistor 76 is coupled to the output of inverter 77. The input of inverter 78 is also coupled to the output of inverter 77. The output of inverter 78 is coupled to a first input of NOR gate 79. As shown in FIG. 1, the input of inverter 77 and the second input of NOR gate 79 are coupled to the output, pull-up control 52, of pre-buffer 26.

In one embodiment, P stack 30 comprises PMOS transistor 67 and PMOS transistor 68. The source of PMOS transistor 67 is coupled to signal VHIGH 40, and the drain of PMOS transistor 67 is coupled to the source of PMOS transistor 68. The control electrode of PMOS transistor 67 is coupled to the drain region of PMOS transistor 66 within level shifter 16. The control electrode of PMOS transistor 68 is coupled to output VREF 42.

In one embodiment, pull-up slew rate control circuitry 12 comprises a resistor 62, a PMOS transistor 63, an NMOS transistor 64, an NMOS transistor 65, a PMOS transistor 60, a PMOS transistor 61, a resistor 100, and a resistor 101. A first terminal of resister 62 is coupled to the drain region of PMOS transistor 66, within level shifter 16, and to terminal or node 95. The second terminal of resistor 62 is coupled to the source of PMOS transistor 63. The drain of PMOS transistor 63 is coupled to the drain of NMOS transistor 64. The control electrode for PMOS transistor 63 is coupled to VREF 42. The source of NMOS transistor 64 is coupled to the drain of NMOS transistor 65. The source of NMOS transistor 65 is coupled to ground or VSS. The control electrode for NMOS transistor 65 is coupled to the output of NOR gate 79, within level shifter 16.

The source region, the drain region, and the well region or body of PMOS transistor 60 are coupled or shorted together and are coupled to terminal 95. Note that the term "well" is used to mean a doped region within a semiconductor substrate. Similarly, the source region, the drain region, and the well region or body of PMOS transistor 61 are coupled or shorted together and are coupled to terminal 96. A first terminal of resistor 100 is coupled to terminal 95 and its second terminal is coupled to the control electrode of PMOS transistor 60 and to the control electrode of PMOS transistor 61 via terminal 94. A first terminal of resistor 101 is coupled to the second terminal of resistor 100, the control electrode of PMOS transistor 60, and the control electrode of PMOS transistor 61 via terminal 94. The second terminal of resistor 101 is coupled to terminal 96. It should be appreciated that in one embodiment of the invention, resistor 100 and resistor 101 may be polysilicon resistors, and may additionally be intrinsically doped polysilicon resistors.

As shown in FIG. 1, pre-buffer 26 receives data 44 as a first input and buffer control 46 as a second input. A first output of pre-buffer 26, pull-up control 52 is coupled to the input of inverter 77 and to the control electrode of NMOS transistor 72, within level shifter 16. A second output of pre-buffer 26, pull-down control 54, is coupled to pull-down slew rate control circuitry 14.

In one embodiment, pull-down slew rate control circuitry 14 comprises a PMOS transistor, 82, a resistor 83, a PMOS transistor 80, a PMOS transistor 81, a resistor 104, and a resistor 105. The control electrode of PMOS transistor 82 is coupled to the second output of pre-buffer 26, pull-down control 54. The drain of PMOS transistor 82 is coupled to a first terminal of resistor 83. The second terminal of resistor 83 is coupled to terminal 98. The source region, the drain region, and the well region or body of PMOS transistor 81 are coupled or shorted together and are coupled to terminal or node 98. Similarly, the source region, the drain region and the well region or body of PMOS transistor 80 are coupled or shorted together and are coupled to terminal or node 97. A first terminal of resistor 104 is coupled to terminal 97, and the second terminal of resistor 104 is coupled to the control electrode of PMOS transistor 80 and to the control electrode of PMOS transistor 81 via terminal 99. A first terminal of resistor 105 is coupled to the second terminal of resistor 104, to the control electrode of PMOS transistor 80, and to the control electrode of PMOS transistor 81 via terminal 99. The second terminal of resistor 105 is coupled to terminal 98.

In one embodiment, N stack 32 comprises an NMOS transistor 85, an NMOS transistor 86, an NMOS transistor 87, and an NMOS transistor 88. The source region of NMOS transistor 85, the source region of NMOS 86, and the source region of NMOS transistor 87 are coupled to the drain region of NMOS transistor 88. The source of NMOS transistor 88 is coupled to VSS or ground. The control electrode of NMOS transistor 88 is coupled to the second terminal of resistor 83 and to terminal 98.

In one embodiment, electrostatic discharge circuit 20 comprises a resistor 89, a resistor 90, a resistor 91, a resistor 102, a resistor 103, and an input protection device 92. As shown in FIG. 1, input/output pad 38 receives a bi-directional signal 50 and it is coupled to a first terminal of input protection device 92, a first terminal of resistor 102, a first terminal of resistor 103, a first terminal of resistor 91, a first terminal of resistor 90, a first terminal of resistor 89, and the drain region of PMOS transistor 68, within P stack 30. The second terminal of resistor 89 is coupled to the drain region of NMOS transistor 85, within N stack 32. Similarly, the second terminal of resistor 90 is coupled to the drain region of NMOS transistor 86, within N stack 32, and the second terminal of resistor 91 is coupled to the drain region of NMOS transistor 87, which is also within N stack 32. The second terminal of resistor 102 is coupled to terminal 96 within pull-up slew rate control circuitry 12. Similarly, the second terminal of resistor 103 is coupled to terminal 97 within pull-down slew rate control circuitry 14. The second and third terminals of input protection device 92 are coupled together and are coupled to VSS or ground.

As shown in FIG. 1, input circuitry 28 is coupled to the drain region of NMOS transistor 88 within n-stack 32, and provides data 48 as an output. In addition, the drain region of NMOS transistor 84 is coupled to the second terminal of resistor 83 within pull-down slew rate control circuitry 14, and the control electrode of NMOS transistor 84 is coupled to the second output of pre-buffer 26, pull-down control 54. The source region of NMOS transistor 84 is coupled to VSS or ground. In one embodiment of the present invention, the control electrodes of transistors 64, 71, 75, and 85–87 are coupled to VPOWER.

Figure 2:
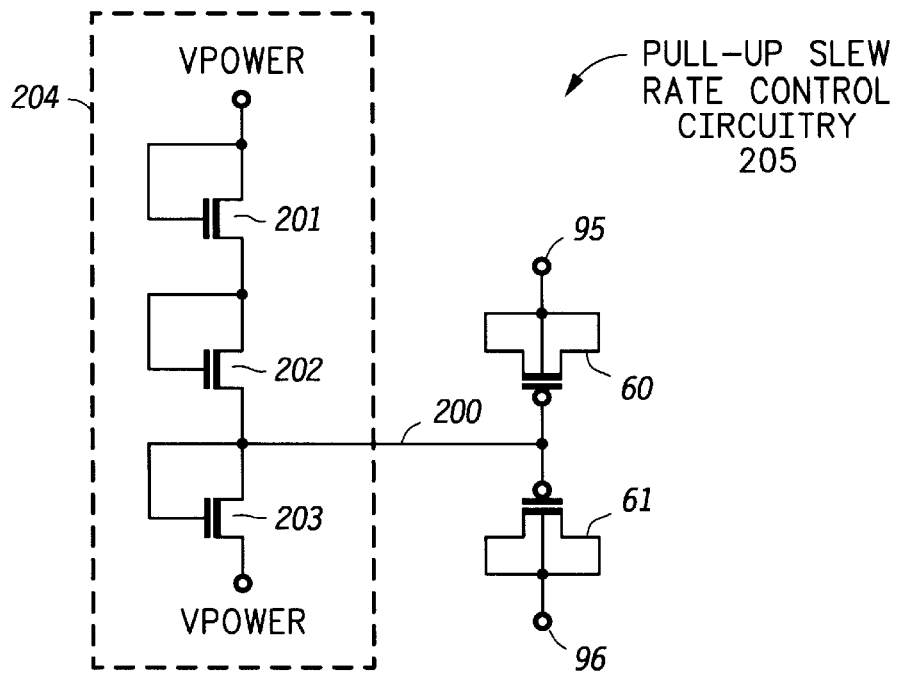
FIG. 2 illustrates, in schematic diagram form, an alternate embodiment of circuit 22 of FIG. 1 in accordance with an alternate embodiment of the present invention.

Shown in FIG. 2 is pull-up slew rate control circuitry 205 in accordance with an alternative embodiment of the present invention. In this embodiment, pull-up slew rate control circuitry 205 comprises a first PMOS transistor 60, a second PMOS transistor 61, and clamping circuitry 204. Clamping circuitry 204 is coupled to the control electrode of PMOS transistor 60 and to the control electrode of PMOS transistor 61 via interconnect 200. The source region, the drain region, and the well region or body of PMOS transistor 60 are coupled or shorted together and are coupled to terminal 95. Similarly, the source region, the drain region, and the body or well region of PMOS transistor 61 are coupled or shorted together and are coupled to terminal 96.

In one embodiment, clamping circuitry 204 comprises a first NMOS transistor 203, a second NMOS transistor 202, and a third NMOS transistor 201. The control electrode of NMOS transistor 201 is coupled to a first source/drain region of NMOS transistor 201, which is coupled to signal VPOWER. The control electrode of NMOS transistor 202 is coupled to a first source/drain region of NMOS transistor 202 and to the second source/drain region of NMOS transistor 201. Similarly, the control electrode of NMOS transistor 203 is coupled to a first source/drain region of NMOS transistor 203 and to a second source drain region of NMOS transistor 202. The second source/drain region of NMOS transistor 203 is coupled to VPOWER. As shown in FIG. 2, the control electrode of NMOS transistor 203 is coupled to the control electrode of PMOS transistor 60 and to the control electrode of PMOS transistor 61 via interconnect 200.

Figure 3:
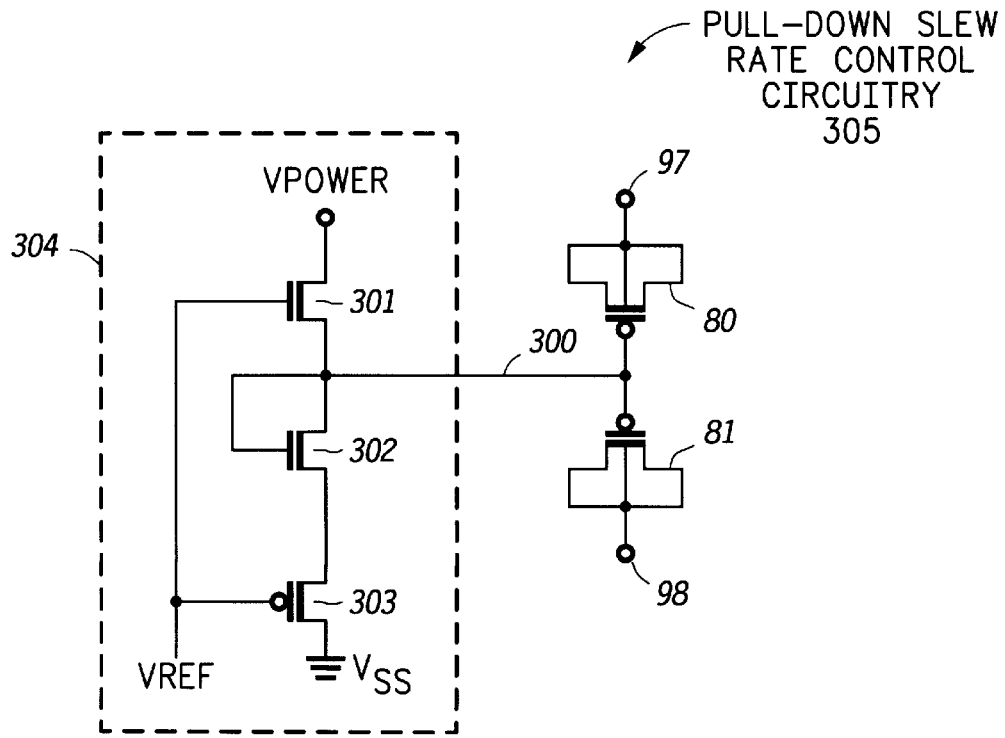
FIG. 3 illustrates, in schematic diagram form, an alternate embodiment of circuit 24 of FIG. 1 in accordance with an alternate embodiment of the present invention.

Shown in FIG. 3 is pull-down slew rate control circuitry 305 in accordance with an alternative embodiment of the present invention. In one embodiment, pull-down slew rate control circuitry 305 comprises a first PMOS transistor 80, a second PMOS transistor 81, and clamping circuitry 304. Clamping circuitry 304 is coupled to the control electrode of PMOS transistor 80 and to the control electrode of PMOS transistor 81 via interconnect 300. The source region, the drain region, and the well region or body of PMOS transistor 80 are coupled or shorted together and are coupled to terminal 97. Similarly, the source region, the drain region, and the well region or body of PMOS transistor 81 are coupled or shorted together and are coupled to terminal 98.

In one embodiment, clamping circuitry 304 comprises a PMOS transistor 303, a first NMOS transistor 302, and a second NMOS transistor 301. The control electrode of PMOS transistor 303 and the control electrode of NMOS transistor 301 are coupled to VREF 42. A first source/drain region of NMOS transistor 301 is coupled to signal VPOWER. A first source/drain region of NMOS transistor 302 is coupled to the control electrode of NMOS transistor 302, to the second source/drain region of NMOS transistor 301, and to the control electrodes of PMOS transistors 80 and 81 via interconnect 300. A first source drain region of PMOS transistor 303 is coupled to the second source/drain region of NMOS transistor 302. The second source/drain region of PMOS transistor 303 is coupled to ground or VSS.

Shown in FIG. 4 is voltage reference generation circuitry 18 in accordance with one embodiment of the present invention. Voltage reference generation circuit 18 comprises a high current voltage reference generation circuit 401 and a low current voltage reference generation circuit 400.

In one embodiment, high current voltage reference generation circuit 401 comprises a first inverter 402, an NMOS transistor 423, an NMOS transistor 422, a PMOS transistor 421, a PMOS transistor 420, a PMOS transistor 424, a PMOS transistor 429, a PMOS transistor 425, a PMOS transistor 430, a PMOS transistor 431, a PMOS transistor 432, an NMOS transistor 426, an NMOS transistor 427, a second inverter 428, and an NMOS transistor 433. The input of inverter 402 is coupled to a low power stop (LPSTOP) control signal 11. The output of inverter 402 is coupled to the control electrode of NMOS transistor 423, to the input of inverter 428, and to the control electrode of NMOS transistor 433. The source of NMOS transistor 423 is coupled to ground or VSS, and the drain of NMOS transistor 423 is coupled to the source of NMOS transistor 422. The drain of NMOS transistor 422 is coupled to the drain of PMOS transistor 421. The control electrode of PMOS transistor 421 is coupled to VREF 42. The source of PMOS transistor 421 is coupled to the drain of PMOS transistor 420, and the source of PMOS transistor 420 is coupled to signal VHIGH 40.

Similarly, the source of PMOS transistor 424 is coupled to signal VHIGH 40, and the control electrode of PMOS transistor 424 is coupled to the drain region of PMOS transistor 420. The drain region of PMOS transistor 424 is coupled to the source region of PMOS transistor 425 and to the control electrode of PMOS transistor 420. The control electrode of PMOS transistor 425 is coupled to. VREF 42. The drain of PMOS transistor 425 is coupled to the drain of NMOS transistor 426. The source of NMOS transistor 426 is coupled to the drain of NMOS transistor 427. The control electrode of NMOS transistor 427 is coupled to the output of inverter 428, and the source of NMOS transistor 427 is coupled to ground or VSS.

The source of PMOS transistor 429 is coupled to signal VHIGH 40. The control electrode of PMOS transistor 429 is coupled to the control electrode of PMOS transistor 424 and to the drain region of PMOS transistor 420. The drain of PMOS transistor 429 is coupled to the source of PMOS transistor 430. The drain of PMOS transistor 430 is coupled to the control electrode of PMOS transistor 430 and to the source of PMOS transistor 431. The control electrode of PMOS transistor 431 is coupled to VREF 42. The drain of PMOS transistor 431 is coupled to the source of PMOS transistor 432 and to VREF 42. The drain of PMOS transistor 432 is coupled to the control electrode of PMOS transistor 432 and to the drain of NMOS transistor 433. The source of NMOS transistor 433 is coupled to ground or VSS. It is important to note that PMOS transistor 430 and PMOS transistor 431 form a first resistive element in high current voltage reference generation circuit 401 and that PMOS transistor 432 also forms a second resistive element in high current voltage reference generation circuit 401.

In one embodiment, low current voltage reference generation circuit 400 comprises a PMOS transistor 412, a PMOS transistor 413, a PMOS transistor 414, a PMOS transistor 415, a PMOS transistor 416, a PMOS transistor 417, a PMOS transistor 418, a PMOS transistor 410, and an NMOS transistor 411. The source of PMOS transistor 412 is coupled to signal VHIGH 40. The drain of PMOS transistor 412 is coupled to the source of PMOS transistor 413 and to the control electrode of PMOS transistor 412. The drain of PMOS transistor 413 is coupled to the source of PMOS transistor 414 and to the control electrode of PMOS transistor 413. The drain of PMOS transistor 414 is coupled to the source of PMOS transistor 415 and to the control electrode of PMOS transistor 414. The drain of PMOS transistor 415 is coupled to the source of PMOS transistor 416 and to the control electrode of PMOS transistor 415. The drain of PMOS transistor 416 is coupled to the source of PMOS transistor 417, to VREF 42, and to the control electrode of PMOS transistor 416. The drain of PMOS transistor 417 is coupled to the source of PMOS transistor 418 and to the control electrode of PMOS transistor 417. The drain of PMOS transistor 418 is coupled to VSS or ground and to the control electrode of PMOS transistor 418.

The source region, the drain region, and the well region or body of PMOS transistor 410 are coupled or shorted together and coupled to signal VHIGH 40. The control electrode of PMOS transistor 410 is coupled to VREF 42 and to the control electrode of NMOS transistor 411. The source region, the drain region, and the substrate or body of NMOS transistor 411 are coupled or shorted together and are coupled to VSS or ground. It is important to note that PMOS transistors 412–416 form a first resistive element in low current voltage reference generation circuit 400 and that PMOS transistors 417–418 also form a second resistive element in low current voltage reference generation circuit 400. In an alternative embodiment, PMOS transistors 412–416 can be replaced with a first resistor and PMOS transistors 417–418 can be replaced with a second resistor. In addition, PMOS transistor 410 forms a first capacitive element in low current voltage reference generation circuit 400 and NMOS transistor 411 forms a second capacitive element in low current voltage reference generation circuit 400. It should be appreciated that the first and second capacitive elements could also be achieved using another type of device, such as a polysilicon to polysilicon capacitor. Each N-well or body of PMOS transistors 412–418 and 431–432 is coupled to its own source electrode, respectively. In one embodiment of the present invention, the control electrodes of transistors 422 and 426 are coupled to VPOWER.

OPERATION OF THE PREFERRED EMBODIMENTS

The operation of the present invention will now be described. In one embodiment of the present invention, pull-up slew rate control circuitry 12 and pull-down slew rate control circuitry 14 together are used to control the slew rate of buffering circuitry 10 in order to meet the IEEE 1284 standard for slew rate. Alternate embodiments of the present invention may use slew rate control circuitry 12 and 14 independent of any requirement to meet the IEEE 1284 standard. Note that slew rate control circuitries 12 and 14 are particularly useful in applications in which the internal voltage level used to power the internal circuitry is less than the voltage level that must be driven on the external pad 38. For example, if external pad 38 must be able to drive anywhere from 0–5 volts, and the primary power VPOWER used to power most of the circuitry on the integrated circuit is 3.3 volts, slew rate control circuitry 12 and 14 provides one way of controlling the slew rate at pad 38. Note that 5.0 volts and 3.3 volts are merely used here as examples and that alternate embodiments of the present invention may use different voltages for VPOWER and VHIGH.

Note that in FIGS. 1–4 VPOWER is used to power any circuitry in which the power source is not expressly shown. VHIGH powers the circuitry to which it is expressly coupled. For example, in FIG. 1, VHIGH is used to power voltage reference generation circuitry 18, level shifter 16, and p-stack 30. Data 44 provides the input data to buffering circuitry 10 when buffering circuitry 10 is driving pad 38 as an output. Data 48 is used by buffering circuitry 10 as the path used to provide data to the rest of an integrated circuit when pad 38 is being used as an input. Prebuffer circuit 26 receives data 44 and buffer control signals 46. Prebuffer circuitry 26 then provides a pull-up control signal 52 to level shifter 16 in order to control the pull-up portion of buffering circuitry 10. In addition, prebuffer circuit 26 provides a pull-down control signal 54 to the pull-down portion of buffering circuitry 10 in order to control that portion. When the pull down control signal 54 is low, the input to transistor 88 is high and the n-channel transistors in n-stack 32 are conducting. As a result, the voltage at pad 38 is pulled low. Slew rate control circuitry 14, which includes circuitry 24 and resistor 83, act as a feedback path to limit how quickly the voltage at the input to transistor 88 is increased. As a result of the feedback slowing the ramping of the voltage at transistor 88, the rate at which the voltage at pad 38 drops is decreased.

It is important to note that when the n-stack devices 32 are non-conducting and the p-stack devices 30 are conducting, the input to transistor 88 is at approximately ground and the pad voltage 38 is at approximately VHIGH, then node 99 is approximately half way in between ground and VHIGH. As a result, devices 80 and 81 have approximately one-half VHIGH across gate-to-source, gate-to-drain, or gate-to-well. It is important to realize that the present embodiment thus prevents a voltage range of ground to VHIGH from being present across gate-to-terminal connections of either transistor 80 or 81. Note that since node 99 connects only to the control electrodes of 80 and 81 and no diffusion regions, there is no reverse biased diode leakage to discharge node 99, and therefore the resistive divider consisting of 104 and 105 determines the voltage of node 99. Thus, in some embodiments of the present invention, the high impedance resistors 104 and 105 can merely be natural non-destructive leakage mechanisms such as tunneling.

Note that the same analysis can be performed for p-stack 30 and pull-up slew rate control circuitry 12 and that transistors 60 and 61 are protected from having a voltage of VHIGH across the gate-to-source, drain, or well. In order to increase the capacitance between node 97 and 98, while also minimizing the capacitance between node 97 and any other node, or node 98 and any other node, the well of transistor 80 is coupled to node 97 and the well of transistor 81 is coupled to node 98. The pull-up portion of buffering circuitry 10 operates in a similar fashion to what has been described for the pull-down portion of buffering circuitry 10 with one significant difference. The voltage on the control electrode of transistor 88 varied between approximately ground and VPOWER whereas the voltage on the control electrode of transistor 67 may vary between VHIGH and one p-channel threshold voltage above VREF.

In order to reduce the current utilized by level shifter 16, gates 77, 78, and 79 are used to slow the rate at which transistor 65 becomes conducting in order to approximately match the rate at which transistor 66 becomes non-conducting in order to reduce the cross over current from VHIGH to ground through transistor 66, 63, 64 and 65. Note that the actual slew rate used by pull-up slew rate control circuitry 12 may be adjusted by varying the magnitude of resistive element 62 and the capacitance of transistors 60 and 61. Similarly, the pull-down slew rate of pull-down slew rate control circuitry 14 may be adjusted by varying the magnitude of resistor 83 and the capacitance of transistors 80 and 81.

FIG. 2 illustrates an alternate embodiment 204 of pull-up slew rate control circuitry 12 illustrated in FIG. 1. The portions of FIG. 2 that may be the same as those portions of FIG. 1 use the same reference numerals. Thus, nodes 95 and 96 correspond to nodes 95 and 96 in FIG. 1 and transistors 60 and 61 similarly correspond to the transistors used in FIG. 1. The circuit illustrated in FIG. 2 substitutes an n-channel device 203 in place of resistive element 101 of FIG. 1. Similarly, FIG. 2 substitutes n-channel transistors 201 and 202 for resistive element 100 in FIG. 1. Note that VPOWER is coupled to one current terminal of transistor 201 and VPOWER is coupled to one current terminal of transistor 203. Thus, node 200 is clamped between a minimum voltage of VPOWER minus two n-channel threshold voltages and a maximum voltage of VPOWER plus one n-channel threshold voltage. This embodiment thus effectively ensures that the voltage across gate-to-source, gate-to-drain, and gate-to-well for both transistors 60 and 61 will not exceed acceptable levels.

Thus, the circuit illustrated in FIG. 2 effectively clamps the voltage at node 200 between a preselected range, whereas resistors 100 and 101 illustrated in FIG. 1 will perform the same function, but may utilize more power. Thus, the pull-up slew rate control circuitry 205 illustrated in FIG. 2 performs the same function as pull-up slew rate control circuitry 12 illustrated in FIG. 1 in terms of controlling slew rate, yet circuit 205 performs that function while using no DC power.

Similarly, the pull-down slew rate control circuitry 305 illustrated in FIG. 3 may be substituted for the pull-down slew rate control circuitry 14 illustrated in FIG. 1. Nodes 97 and 98 in FIG. 3 correspond to nodes 97 and 98 in FIG. 1. Similarly, transistors 80 and 81 in FIG. 3 may be the same as transistors 80 and 81 in FIG. 1. Referring to FIG. 3, transistors 301, 302, and 303 in combination are used to damp the voltage at node 300 within a predetermined range. Thus, node 300 is constrained between a minimum of the reference voltage minus one n-channel threshold voltage, and a maximum of VREF plus one p-channel threshold voltage magnitude plus one n-channel threshold voltage. The functionality of the pull-down slew rate control circuitry 305 illustrated in FIG. 3 is the same as pull-down slew rate control circuitry 14 illustrated in FIG. 1; however, circuitry 305 may perform this functionality using no DC power.

FIG. 4 illustrates one embodiment of voltage reference generation circuitry 18 of FIG. 1. In the embodiment of the present invention illustrated in FIG. 4, the VREF voltage that is generated is less than VPOWER. This VREF voltage is used by level shifter circuitry 16 and p-stack 30 of FIG. 1 in order to prevent any of the transistors within those circuits from being overstressed when they are non-conducting by preventing excessive voltage between the gate terminal and any one of the source, drain, or body terminals of each transistor. The circuit illustrated in FIG. 4 provides a VREF voltage which, in one embodiment, is equal to VHIGH minus (1.1×VPOWER). Other embodiments may vary the value of VREF while still preventing the electrical overstress of non-conducting PMOS transistors. In addition, the circuit illustrated in FIG. 4 may be a very low power circuit due to the fact that circuit 400 is always used and draws very little current through transistors 412–418. In addition, circuit 401 may optionally be turned on or off depending on whether a larger current is used to drive the reference 42.

In one embodiment of the present invention, circuit 400 draws tens of nanoamperes of current while circuit 401 draws hundreds of microamperes of current. Note that although FIG. 1 illustrates buffering circuitry 10 for one I/O pad 38, VREF 42 may be the sole voltage reference source for multiple pads 38. For example, an integrated circuit, not shown, may include dozens of pads 38, all driven by a single voltage reference generation circuitry 18. Note that large decoupling capacitors effectively implemented by way of transistors 410 and 411 in FIG. 4 are used to clamp VREF 42 to minimize variations in VREF 42 (e.g. due to transitions on output 50 and due to capacitive coupling between pad 38 and the control terminal of transistor 68 (see FIG. 1)). In one embodiment of the circuit illustrated in FIG. 4, a low power stop control signal 11 is provided to circuit 401 in order to selectively enable circuit 401 to provide extra current drive capability to VREF 42. Note that when the low power stop control signal 11 is high, thus selecting the low power stop mode, then both transistors 433 and 429 must be non-conducting in order to not effect the voltage level of VREF 42.

Note that electrostatic discharge (ESD) circuit 20 may be used in order to help provide electrostatic discharge protection to pad 38. The output N channel pull down path for pad 38 may be provided with improved ESD protection by using a single lumped resistor (not shown) between the diffusion contacts at the drain of each of the N channel transistors 85–87, within N stack 32, and the pad 38. In addition, the ballast resistor (not shown) between the diffusion contacts at the drain of N channel transistors 85–87 and the gate polysilicon of N channel transistors 85–87 may be an additional causes of resistance in the output N channel pull down path. Increasing the resistance of the single lumped resistor increases the turn on voltage of the parasitic lateral NPN transistor formed within the N stack 32. This is desirable because the thick field device (TFD) 92 will become conducting before the parasitic lateral NPN transistor becomes conducting, and the TFD 92 will thus carry the ESD zap current. Increasing the resistance, however, degrades the output AC performance of pad 38 and also adds an undesirable offset in the DC output low voltage (VOL) at pad 38. As an example, consider an output specified at VOL=0.5 volts and IOL=15 milliamperes, where IOL is the specified output sink current. In order to limit the IR drop across the single lumped resistor to 10% of the specified VOL, only 0.05 volts can be applied across the single lumped resistor.

$$0.05 \text{ V} = IR = 15 \text{ ma}^* R \rightarrow R = 3.33 \text{ ohms}$$

However, in an alternate embodiment illustrated in FIG. 1, the output N channel pull down path for pad 38 includes three resistive fingers, namely resistors 89–91. More specifically, resistors 89–91, each having a resistive value "R", have been added between the drain electrode of each of the N channel transistors 85–87, within N stack 32, and the pad 38. The equivalent resistance (Req) between N stack 32 and the pad 38 is Req=R/3. Maintaining Req at 3.33 ohms, as for the single lumped resistor, implies that each resistor 89–91 can be 10 ohms. The parallel nature of resistors 89–91 makes it possible to increase the resistance between N stack 32 and the pad 38, and thus to increase the turn on voltage for the parasitic lateral NPN during an ESD event. If an ESD event occurs, it will occur between the pad 38 and a single finger, for example the finger which includes resistor 89 and transistor 85. Note that although FIG. 1 illustrates the use of three resistive fingers, namely finger 89,85, finger 90, 86, and finger 91, 87, alternate embodiments may use any number of fingers.

It should be appreciated that if VHIGH 40 and VPOWER are powered down and an I/O pad (not shown) coupled to VHIGH 40 is driven high externally, this will force VHIGH 40 to be a diode lower in voltage so that all IEEE 1284 I/O pads coupled to VHIGH 40 are powered up. In addition, PMOS transistor 67 may be turned on which would enable the output pull-up for the I/O pad (not shown) and possibly other pads which are also coupled to VHIGH 40. If one I/O is driven low externally but the output pull-up is enabled, then there is a conflict between how the I/O is being driven externally versus how it is being driven internally by the buffer circuitry. This may cause unnecessary power dissipation and possibly reliability problems. Since VPOWER would be at a ground potential there is no current path in the output pull-down path to a ground potential.

Therefore, additional circuitry is required to force PMOS transistor 67 to be turned off if another I/O pad coupled to VHIGH 40 is driven low externally. For example, in one embodiment an additional weak PMOS transistor is added to level shifter 16, wherein its control electrode is coupled to VREF 42, its drain is coupled to the control electrode of PMOS transistor 67, and its source is be coupled to VHIGH 40. In addition, two PMOS transistors are also added to level shifter 16. These PMOS transistors (not shown) are coupled in series with the drain of the first transistor being coupled to the source of the second transistor. The source of the first PMOS transistor is then coupled to the control electrode of PMOS transistor 66. The control electrode of the first PMOS transistor is connected to VREF 42. The control electrode of the second PMOS transistor is connected to VPOWER. The source electrode of the second PMOS transistor is connected to VSS or ground.

While the present invention has been illustrated and described with reference to specific embodiments, further modifications and improvements will occur to those skilled in the art. It is to be understood, therefore, that this invention is not limited to the particular forms illustrated and that it is intended in the appended claims to cover all modifications that do not depart from the spirit and scope of this invention.

What is claimed is:

1. Circuitry formed on an integrated circuit, the circuitry comprising:
    a first terminal;
    a second terminal;
    a first transistor having a first body, a first control electrode, a first source region, and a first drain region, wherein:
        the first body, the first source region, and the first drain region are shorted together and are coupled to the first terminal; and
    a second transistor having a second body, a second control electrode, a second source region, and a second drain region, wherein:
        the second body, the second source region, and the second drain region are shorted together and are coupled to the second terminal,
        the second control electrode is coupled to the first control electrode, and the second transistor is of a same conductivity type as the first transitor.

2. The integrated circuit of claim 1, wherein the first body is further characterized as a well region.

3. The integrated circuit of claim 1, wherein the circuitry is further characterized as having voltage clamping circuitry coupled to the first control electrode and the second control electrode.

4. The integrated circuit of claim 3, wherein the voltage clamping circuitry is further characterized as comprising
- a PMOS transistor having a control electrode, a first source/drain region, and a second source/drain region,
- a first NMOS transistor having a control electrode, a first source/drain region, and a second source/drain region, wherein the control electrode of the first NMOS transistor is coupled to the control electrode of the PMOS transistor, and
- a second NMOS transistor having a control electrode, a first source/drain region, and a second source/drain region, wherein the control electrode of the second NMOS transistor is coupled to the first control electrode of the first transistor and the second control electrode of the second transistor, and the second source/drain region of the PMOS transistor is coupled to the first source/drain region of the second NMOS transistor and the first source/drain region of the first NMOS transistor is coupled to the second source/drain region of the second NMOS transistor.

5. The integrated circuit of claim 3, wherein the voltage clamping circuitry is further characterized as comprising
- a first NMOS transistor having a control electrode, a first source/drain region, and a second source/drain region, wherein the control electrode of the first NMOS transistor is coupled to the first control electrode of the first transistor and the second control electrode of the second transistor,
- a second NMOS transistor having a control electrode, a first source/drain region, and a second source/drain region, wherein the control electrode of the second NMOS transistor is coupled to the second source/drain region of the second NMOS transistor and the first source/drain region of the second NMOS transistor is coupled to the second source/drain region of the first NMOS transistor, and
- a third NMOS transistor having a control electrode, a first source/drain region, and a second source/drain region, wherein the control electrode of the third NMOS transistor is coupled to the second source/drain region of the third NMOS transistor and the first source/drain region of the third NMOS transistor is coupled to the second source/drain region of the second NMOS transistor.

6. The integrated circuit of claim 1, wherein the circuitry further comprises:
- a third transistor having a third control electrode, a third source region, and a third drain region, wherein the third control electrode is coupled to the first terminal; and
- a fourth transistor having a fourth control electrode, a fourth source region, and a fourth drain region, wherein the fourth source region is coupled to the third drain region of the third transistor.

7. The integrated circuit of claim 6, wherein the buffer circuitry further comprises voltage reference generation circuitry having an output, wherein the output of the voltage reference generation circuitry is coupled to the fourth control electrode of the fourth transistor.

8. The integrated circuit of claim 7, wherein the voltage reference generation circuitry is further characterized as comprising
- a first resistive element having a first terminal and a second terminal, wherein the first terminal is coupled to a first voltage and the second terminal is coupled to the output of the voltage reference generation circuitry,
- a first capacitive element having a first terminal and a second terminal, wherein the first terminal is coupled to the first voltage and the second terminal is coupled to the output of the voltage reference generation circuitry,
- a second resistive element having a first terminal and a second terminal, wherein the first terminal is coupled to a second voltage and the second terminal is coupled to the output of the voltage reference generation circuitry,
- a second capacitive element having a first terminal and a second terminal, wherein the first terminal is coupled to the second voltage and the second terminal is coupled to the output of the voltage reference generation circuitry.

9. The integrated circuit of claim 8, wherein the voltage reference generation circuitry further comprises
- a fifth transistor having a control electrode, a first source/drain region, and a second source/drain region, wherein the first source/drain region is coupled to the first voltage,
- a third resistive element having a first terminal and a second terminal, wherein the first terminal is coupled to the second source/drain region of the fifth transistor and the second terminal is coupled to the output of the voltage reference generation circuitry,
- a fourth resistive element having a first terminal and a second terminal, wherein the first terminal is coupled to the output of the voltage reference generation circuitry,
- a sixth transistor having a control electrode, a first source/drain region, and a second source/drain region, wherein the first source/drain region is coupled to the second terminal of the fourth resistive element and the control electrode is coupled to a low power stop control signal.

10. The integrated circuit of claim 9, wherein the third resistive element is further characterized as a third plurality of transistors connected in series.

11. The integrated circuit of claim 1, wherein circuitry is further characterized as buffer circuitry, and wherein the buffer circuitry further comprises:
- an input/output pad;
- a plurality of transistors, each of the plurality of transistors having a source region and a drain region, wherein the source region of each transistor in the plurality of transistors is coupled to the third drain region of the third transistor; and
- a plurality of resistors, each resistor in the plurality of resistors having a first terminal and a second terminal, wherein the first terminal of each resistor in the plurality of resistors is coupled to the input/output pad and the drain region of each transistor in the plurality of transistors is coupled to the second terminal of one resistor.

12. The integrated circuit of claim 1, wherein the first transistor and the second transistor are further characterized as PMOS transistors.

13. The integrated circuit of claim 12, wherein:
the first control electrode of the first transistor is further characterized as a first gate electrode;
the second control electrode of the second transistor is further characterized as a second gate electrode; and
the first gate electrode is connected to the second gate electrode.

14. The integrated circuit of claim 1, wherein the first transistor and the second transistor are further characterized as NMOS transistors.

15. The integrated circuit of claim 14, wherein:
the first control electrode of the first transistor is further characterized as a first gate electrode;
the second control electrode of the second transistor is further characterized as a second gate electrode; and
the first gate electrode is connected to the second gate electrode.

* * * * *